US012754273B2

(12) United States Patent
Börnert et al.

(10) Patent No.: US 12,754,273 B2
(45) Date of Patent: Oct. 6, 2026

(54) DEVICE AND METHOD FOR PROSPECTIVE CORRECTION FOR GRADIENT PULSE SHAPE DISTORTIONS IN MRI IMAGING

(71) Applicant: KONINKLIJKE PHILIPS N.V., Eindhoven (NL)

(72) Inventors: Peter Ulrich Börnert, Hamburg (DE); Juergen Erwin Rahmer, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 128 days.

(21) Appl. No.: 18/291,946

(22) PCT Filed: Jul. 28, 2022

(86) PCT No.: PCT/EP2022/071191
§ 371 (c)(1),
(2) Date: Jan. 25, 2024

(87) PCT Pub. No.: WO2023/012026
PCT Pub. Date: Feb. 9, 2023

(65) Prior Publication Data

US 2024/0377493 A1 Nov. 14, 2024

(30) Foreign Application Priority Data

Aug. 6, 2021 (EP) .................................... 21190021

(51) Int. Cl.

| | |
|---|---|
| ***G01R 33/56*** | (2006.01) |
| ***G01R 33/385*** | (2006.01) |
| ***G01R 33/565*** | (2006.01) |

(52) U.S. Cl.
CPC ... *G01R 33/56572* (2013.01); *G01R 33/3852* (2013.01)

(58) Field of Classification Search
CPC .... G01R 33/14; G01R 33/00; G01R 33/0035; G01R 33/0023; G01R 33/0017; G01R 31/3191; G01R 33/56572; G01R 33/3852
See application file for complete search history.

(56) References Cited

U.S. PATENT DOCUMENTS

| | | | | |
|---|---|---|---|---|
| 5,057,776 A * | 10/1991 | Macovski | ............ | G01R 33/445 324/309 |
| 6,377,043 B1 * | 4/2002 | Aldefeld | ............ | G01R 33/3852 324/309 |

(Continued)

FOREIGN PATENT DOCUMENTS

| | | | |
|---|---|---|---|
| CN | 113128753 A * | 7/2021 | ............. G06Q 10/04 |
| EP | 3543722 A1 | 9/2019 | |
| WO | 2019179797 A1 | 3/2019 | |

OTHER PUBLICATIONS

C. Aigner et al “Time Optimal Control-Based RFT Pulse Design Under Gradient Imperfections”.

(Continued)

*Primary Examiner* — Lee E Rodak
*Assistant Examiner* — Taqi R Nasir

(57) ABSTRACT

For a gradient system (102, 300) for a magnetic resonance imaging system (100) a solution for improving the control of gradient fields for a higher image quality shall be created. This is achieved by a gradient system (102, 300) the gradient system (102, 300) comprising: at least one gradient coil (110, 310) for generating the gradient magnetic field when supplied with electrical current, wherein the gradient coil (110, 310) is configured for generating at least one selection gradient magnetic field by transmitting selection gradient pulses, wherein the gradient system (102, 300) comprises a gradient coil amplifier (112, 308) configured for supplying the electrical current to the gradient coil (110, 310), the gradient system (102, 300) further comprising a current sensor system (113, 312) configured for sampling an electrical current supplied to the gradient coil (110, 310) by the gradient coil amplifier (112, 308), wherein the gradient system (102, 300) is further configured to obtain an actual selection gradient pulse shape (304) of the selection gradient magnetic field by applying a current to field modulation transfer function (CGMTF) to the sampled electrical current, which enables a magnetic resonance examination system (100) to compensate for the deviation of the actual selection gradient pulse shape (304) from an input selection gradient pulse shape (302) by adjusting radio frequency pulses (316) emitted simultaneously with the selection gradient pulses. The present invention also concerns a magnetic resonance (Continued)

imaging system (100), a method of operating a gradient system (102, 300) and a computer program product.

15 Claims, 3 Drawing Sheets

(56) References Cited

U.S. PATENT DOCUMENTS

| | | | | |
|---|---|---|---|---|
| 2019/0148021 | A1* | 5/2019 | Styner .................... | A61B 5/055 705/2 |
| 2020/0182952 | A1 | 6/2020 | Hong et al. | |

OTHER PUBLICATIONS

Rahmer et al "Non-Cartesian K-Space Trajectory Calculation Based on Concurrent Reading of the Gradient Amplifiers Output Currents" Magnetic Resonance in Med. vol. 85, No. 6 Feb. 18, 2021 p. 3060-3070.

International Search Report and Written Opinion from PCT/EP2022/071191 mailed Oct. 21, 2022.

Spielman DM, Pauly JM. Spiral imaging on a small-bore system at 4.7T. Magn Reson Med. Oct. 1995;34(4):580-5.

Pauly J, Nishimura D, Macovski A. "A k-space analysis of small-tip-angle excitation" Journal of Magnetic Resonance 1989;81:43-56.

Rahmer J, Mazurkewitz P, Börnert P, Nielsen T. Rapid acquisition of the 3D MRI gradient impulse response function using a simple phantom measurement. Magnetic Resonance in Medicine 2019;82:2146-2159.

Vannesjo et al "Image Reconstruction Using a Gradient Impulse Response Model for Trajectory Prediction" Magnetic Resonance in Med. vol. 76 p. 45-58 (2016).

* cited by examiner

DEVICE AND METHOD FOR PROSPECTIVE CORRECTION FOR GRADIENT PULSE SHAPE DISTORTIONS IN MRI IMAGING

CROSS REFERENCE TO RELATED APPLICATIONS

This application is a U.S. national phase application of International Application No. PCT/EP2022/071191 filed on Jul. 28, 2022, which claims the benefit of EP Application Serial No. 21190021.2 filed on Aug. 6, 2021 and is incorporated herein by reference.

FIELD OF THE INVENTION

The invention relates to magnetic resonance imaging, in particular to a gradient system for a magnetic resonance imaging system. The invention also relates to a method of operating a gradient system and a computer program product.

BACKGROUND OF THE INVENTION

A gradient system 200 consists of multiple components as illustrated in FIG. 2, is the key element to facilitate spatial encoding of the MR signal in an MRI scanner. The input demand waveform g, 202 will appropriately be pre-emphasised, by a corresponding pre-emphasizing unit 206, and amplified by the gradient amplifier 208 to generate the corresponding currents that are driving the gradient coil 210 to produce the desired field response. This process can be described in an LTI (linear time invariant) sense by a transfer function (gradient impulse response function, GIRF or gradient modulation transfer function, GMTF see FIG. 2). However, the gradient amplifier 208 can introduce some non-linearities which are hard to predict and violate strict LTI assumptions. When simpler/cheaper components are used in the gradient amplifier 208 the non-linearity effects might become more serious, making waveform prediction to be used in reconstruction rather difficult. Bad image quality is the consequence. Basic current sensing with a current sensing system 212 has been proposed to mitigate this problem. On top of the approach a current to field modulation transfer function, CGMTF, that describes how the gradient coil 210 is translating the input current into the actual gradient field 204, has to be incorporated in this current sensing concept allowing for accurate gradient waveform prediction, based on actual real-time output current measurements.

FIG. 2 schematically depicts a gradient system 200 according to the state of the art. The gradient system schematic shows the relevant transfer functions, GIRF and GMTF and the current-driven reconstruction approach. The gradient system 200 consists of a linear waveform pre-emphasis step 206 for eddy current compensation (ECC), the gradient amplifiers 208 and respective gradient coils 210 (x,y,z). The gradient impulse response function (GIRF) or its Fourier transform, the gradient modulation transfer function (GMTF), describes the complete gradient system 200 behaviour but cannot represent non-linearities occurring in the gradient amplifiers 208. Measuring the gradient amplifier output currents and applying the transfer functions from current to field (current to field impulse response function, CGIRF, current to field modulation transfer function, CGMTF) gives a more accurate description of the field response. If currents are measured concurrently with imaging, accurate k-space trajectories can be derived for image reconstruction.

So far, this concept has been scientifically tested for non-cartesian imaging to derive the actual k-space trajectory present during the MR signal sampling. For this purpose, in parallel to the MR data acquisition also the currents running through the gradient coil 210 are sampled in a synchronized manner. This is a straightforward application because image reconstruction 216 begins after sampling the MR data and at that point the sampled currents that generate the actual gradient waveform 204 and the thus derived k-space trajectory can be made easily available. It should be noted that the current-based correction approach, as discussed here, is limited to the readout gradients, where the k-space trajectory for reconstruction can be adapted to the real fields.

The document WO 2019/179797 A1 discloses a magnetic resonance imaging system with a gradient coil system that comprises a set of gradient coils configured for generating a gradient, a gradient coil amplifier, and a current sensor system configured for measuring current sensor data descriptive of the electrical current supplied to each of the set of gradient coils. Execution of the machine executable instructions causes a processor to: control the magnetic resonance imaging system with the pulse sequence commands to acquire magnetic resonance imaging data; record the current sensor data during the acquisition of the magnetic resonance imaging data; calculate a corrected k-space trajectory using the current sensor data and a gradient coil transfer function; and reconstruct a corrected magnetic resonance image using the magnetic resonance imaging data and the corrected k-space trajectory.

However, when the performance of the gradient amplifiers is too much compromised, also the performance of other gradients involved in the MR scan are compromised. For crusher gradients this is often not much of concern, but it matters in case of MR signal excitation or refocusing processes involving gradients. For optimal performance of spatially selective RF pulses, the behavior of the gradient system must be sufficiently predictable or known in advance.

A real-time feedback of sensed selection gradient currents to the RF transmit object could help to actively steer optimal selection, but it somehow mimics the functionality of the current amplifier control loop with very high bandwidth demands. Such an approach, apart from unknown feasibility and performance, is another undesired cost driver.

U.S. Pat. No. 6,377,043 B1 describes a system that enables the temporal variation of the magnetic field generated by a gradient coil to be derived from the measured temporal variation of the current through gradient coil and from a pulse response which has been determined once and stored for the relevant coil.

A paper titled "Time optimal control-based RFT pulse design under gradient imperfections" by C. Aigner et. al. describes a gradient system imperfections model that fits into a control framework for radio frequency (RF) pulse design.

SUMMARY OF THE INVENTION

It is an object of the invention to improve the control of gradient fields for a higher image quality and to minimize the need for continuous monitoring of the output-current of the gradient amplifier.

According to the invention, this object is addressed by the subject matter of the independent claims. Preferred embodiments of the invention are described in the sub claims.

Therefore, according to the invention, a gradient system for a magnetic resonance examination system for generating a gradient magnetic field within an imaging zone of the magnetic resonance examination system is foreseen, the gradient system comprising:

at least one gradient coil for generating the gradient magnetic field when supplied with electrical current, wherein the gradient coil is configured for generating at least one selection gradient magnetic field by transmitting selection gradient pulses along an axis, wherein the gradient system comprises a gradient coil amplifier configured for supplying the electrical current to the gradient coil, the gradient system further comprising a current sensor system configured for sampling an electrical current supplied to the gradient coil by the gradient coil amplifier, wherein the gradient system is further configured to generate an actual selection gradient pulse shape of the selection gradient magnetic field by applying a current to field modulation transfer function (CGMTF) to the sampled electrical current, which enables a magnetic resonance examination system to compensate for the deviation of the actual selection gradient pulse shape from an input selection gradient pulse shape by adjusting radio frequency pulses emitted simultaneously with the selection gradient pulses.

The basic idea behind is, that instead of only monitoring the read-out gradients, also the selection gradients, or potentially other important ones used for MR signal encoding, are monitored via current sensing. Based on the known input gradient pulse shape and the sensed output currents conclusions can be drawn, how the limited amplifier performance is compromising the output current. Due to the non-linear effect occurring in the active amplifier control loop, these compromising effects cannot be simply modelled but need to rely on measured input. The detected currents are related to actual selection gradient fields via the current to field modulation transfer function (CGMTF) of the corresponding gradient coil channel. The transfer function is used to predict, based on the sensed current, the actual selection gradient pulse shape ($G_f$) in the gradient coil. The invention achieves to avoid the need for continuous monitoring the output-current of the gradient amplifier.

In an embodiment of the invention the selection gradient field is a spatial read-encoding gradient field and/or a crusher gradient field and/or a slice selection gradient field and/or a slice refocusing gradient field and/or a gradient field spatially selective in one or multiple dimensions.

In another aspect the invention provides a magnetic resonance imaging system configured for acquiring magnetic resonance imaging data from an imaging zone, wherein the magnetic resonance imaging system comprises a gradient system as described above.

In another aspect the invention provides a method of operating a gradient system for a magnetic resonance examination system for generating a gradient magnetic field within an imaging zone of the magnetic resonance examination system, wherein the method comprises the following steps:

providing a gradient system as described above, sampling the electrical current supplied to the gradient coil by the gradient coil amplifier by the current sensor system, obtaining an actual selection gradient pulse shape by applying a current to field modulation transfer function, CGMTF to the sampled electrical current, predicting gradient distortions of the actual selection gradient pulse shape based on a known input selection gradient pulse shape, correcting for gradient distortions of the actual selection gradient pulse shape by a magnetic resonance examination system by adapting radio frequency pulse shapes that are emitted concurrently with the actual selection gradient pulses.

In an embodiment of the invention the step of obtaining an actual selection gradient pulse shape by applying a current to field modulation transfer function (CGMTF) to the sampled electrical current comprises the step of obtaining an actual selection gradient pulse shape by a convolution operation according to the following formula:

$$G_f(t)=I(t)*CGMTF(t)$$

wherein:

$G_f(t)$ is the actual selection gradient pulse shape, $I(t)$ is the sampled electrical current, CGMTG(t) is the current to field modulation transfer function up to the desired order (at least zeroth and first order).

In another embodiment of the invention the current to field modulation transfer function is pre-recorded before applying the function to the actual selection gradient pulse shape.

In an embodiment of the invention the step of predicting gradient distortions of the actual selection gradient pulse shape based on a known input selection gradient pulse shape is performed by means of artificial intelligence.

In another embodiment of the invention the step of predicting gradient distortions of the actual selection gradient pulse shape by means of artificial intelligence comprises the step of using a trained convolutional neural network that returns the actual selection gradient pulse shape from parameter values representing the desired gradient pulse shape.

In an embodiment of the invention the parameters values are selected from the following list: max. gradient strength and/or slew rate and/or strength and/or variation when using variable-rate selective excitation (VERSE).

In another embodiment of the invention the step of sampling the electrical current supplied to each of the set of gradient coils by the gradient coil amplifier by the current sensor system, comprises the step of sampling the electrical current during a start-up phase of the magnetic resonance imaging system with initial sequence dummy shots, or a short prep-scan involving those gradient pulses in question.

In an embodiment of the invention the step of correcting for gradient distortions of the actual selection gradient pulse shape by adapting radio frequency pulse shapes that are emitted concurrently with the actual selection gradient pulses takes place in addition to correcting for gradient distortions of a read-out gradient of the gradient system.

In another aspect the invention provides a computer program product comprising instructions, when the program is executed by a computer, cause the computer to carry out the method as described by the method steps above.

In a further aspect the invention provides a computer program product comprising instructions, when the program is executed by a computer, cause the computer to control a magnetic resonance imaging system to correct for gradient distortions of an actual selection gradient pulse shape by adapting radio frequency pulse shapes that are emitted concurrently with the actual selection gradient pulses.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
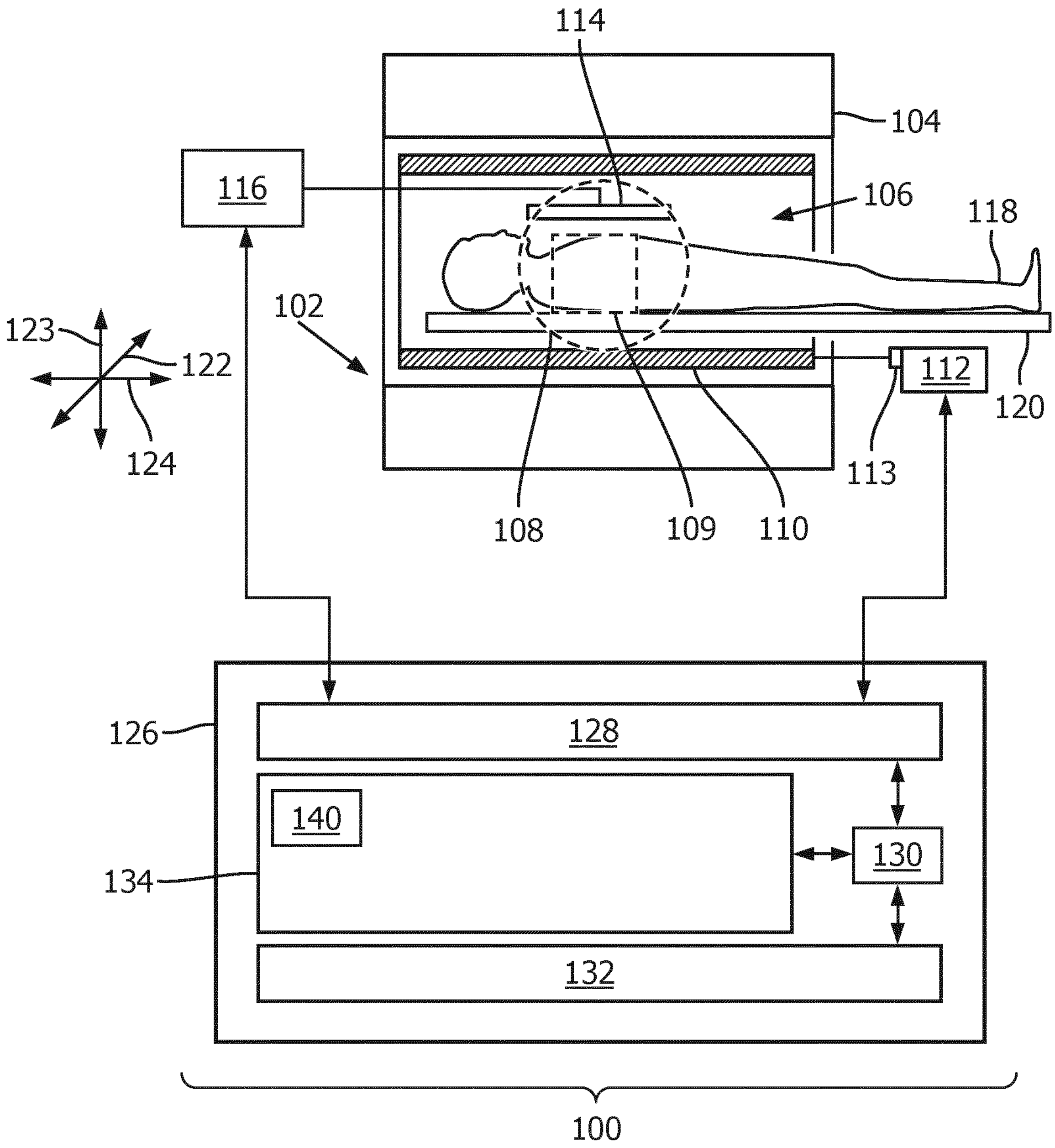
FIG. 1 illustrates an example of a magnetic resonance imaging system according to an embodiment of the invention, FIG. 2 schematically depicts a gradient system according to the state of the art, FIG. 3 schematically depicts a gradient system according to an embodiment of the invention.

FIG. 1 illustrates an example of a magnetic resonance imaging system 100 with a magnet 104 according to an embodiment of the invention. The magnet 104 is a superconducting cylindrical type magnet with a bore 106 through it. The use of different types of magnets is also possible; for instance, it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. The magnetic resonance imaging data that is typically acquired for the region of interest. A subject 118 is shown as being supported by a subject support 120 such that at least a portion of the subject 118 is within the imaging zone 108 and the region of interest 109.

The magnetic resonance imaging system 100 comprises a gradient system 102, wherein the gradient system 102 is the prime spatial encoding system used in magnetic resonance imaging. The gradient system 102 consists of multiple components. Within the bore 106 of the magnet there is at least one gradient coil 110 which used for acquisition of preliminary magnetic resonance imaging data to spatially encode magnetic spins within the imaging zone 108 of the magnet 104. The gradient coil 110 is connected to a magnetic field gradient coil amplifier 112. The gradient coil 110 can e.g. contain three separate coils for spatially encoding in three orthogonal spatial directions. A magnetic field gradient power supply supplies current to the gradient coil. The current supplied to gradient coil 110 is controlled as a function of time and may be ramped or pulsed. The gradient coil 110 can represent in an embodiment of the invention three separate orthogonal gradient coils for generating a gradient magnetic field within the imaging zone 108. These are typically oriented as the axes 122, 123 and 124 show. The axis 124 is aligned with the axis of the magnet 104. This is typically referred to as the z-axis. 122 and 123 are the x and y-axes, respectively. They are orthogonal to each other and also to the z-axis 124.

The magnetic field gradient coil amplifier 112 is configured for supplying current to the gradient coil. The magnetic field gradient coil amplifier 112 is shown as having a current sensor system 113 for measuring the current supplied to the gradient coil 110. The current sensor system 113 could for example be part of the magnetic field gradient coil amplifier 112 or it could also be integrated into the gradient coil 110. Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency coil 114 will have multiple coil elements.

The transceiver 116 and the gradient controller 112 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 134 may be considered to be a non-transitory computer-readable medium. The memory 134 is shown as containing machine-executable instructions 140. The machine-executable instructions 140 enable the processor 130 to control the operation and function of the magnetic resonance imaging system 100. The machine-executable instructions 140 may also enable the processor 130 to perform various data analysis and calculation functions.

Figure 2:
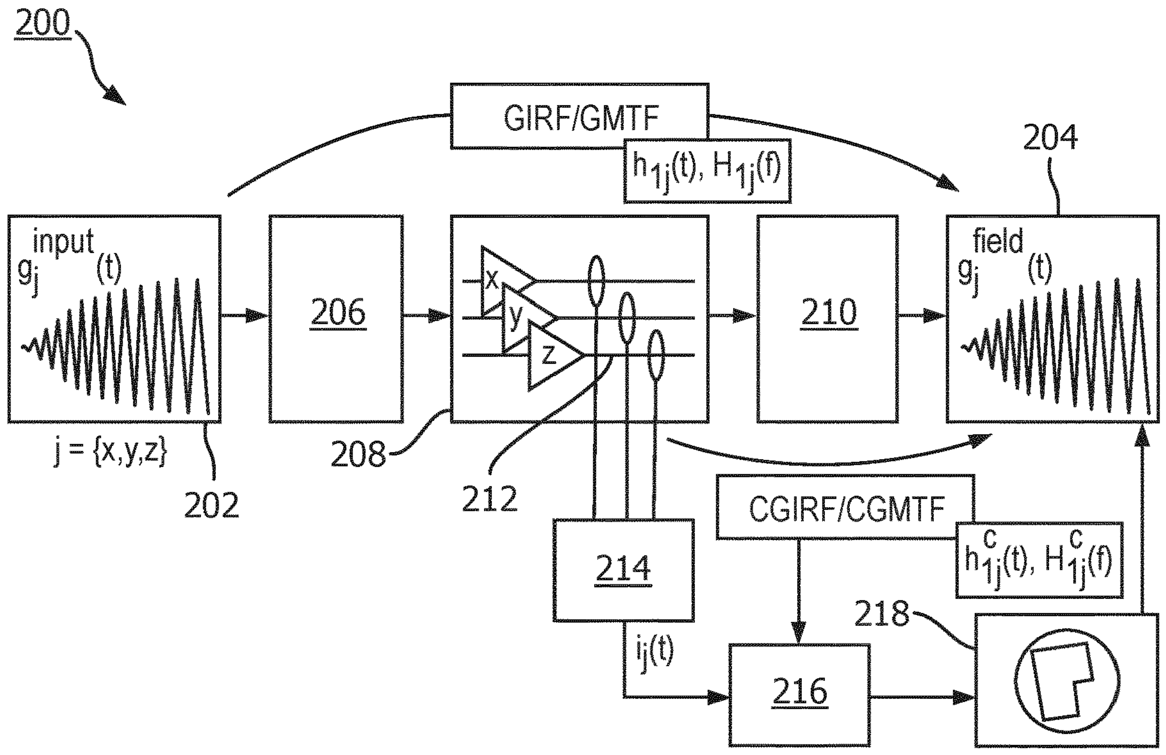
FIG. 2 (prior art)

FIG. 2 schematically depicts a gradient system according to the state of the art which has already been described in the introductory part of the description.

Figure 3:
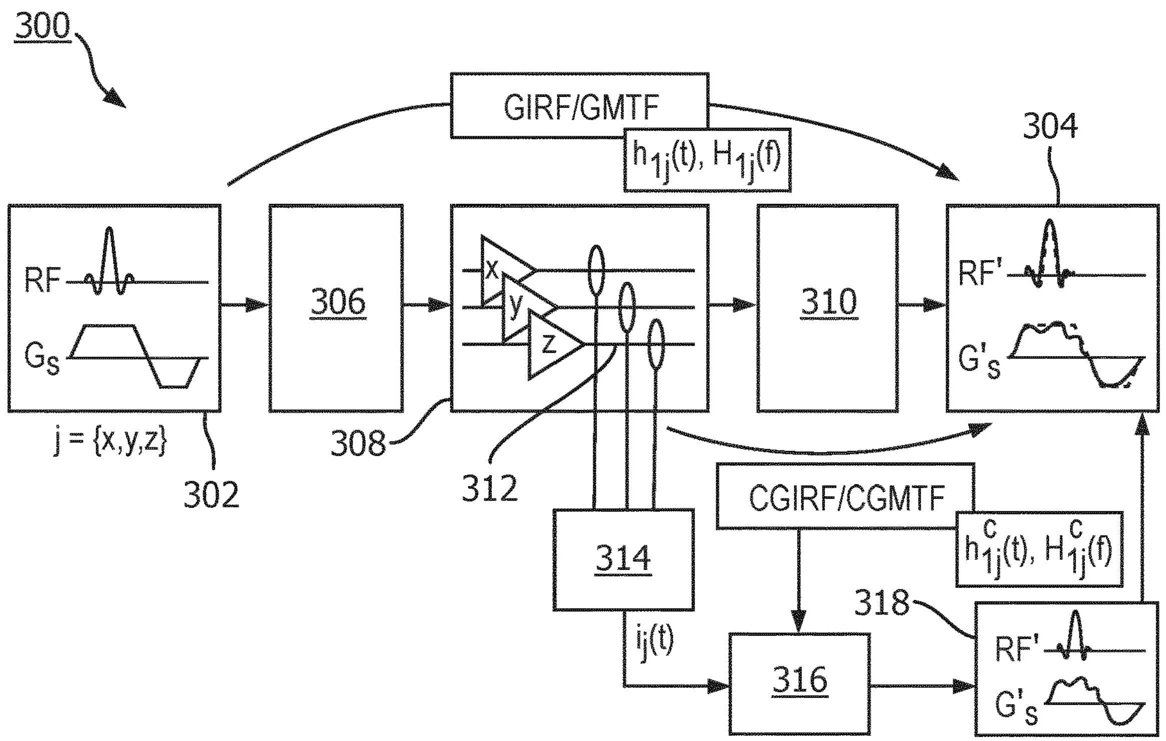

FIG. 3 schematically depicts a gradient system 300 according to an embodiment of the invention. The gradient system schematic shows the relevant transfer functions GIRF, GMTF and the current-driven correction approach CGIRF, CGMTF. Due to serious imperfections in the gradient system 300 (e.g. gradient amplifiers 308) selection gradients $G_S$, here trapezoids, are distorted. Measuring the gradient amplifier 308 output currents and applying the transfer functions from current to field CGIRF, CGMTF gives a more accurate description of the field response. Those distortions can be predicted or measured, and the RF pulse forms can be appropriately adapted to compensate for the gradient field deviations to thus avoid adverse effects on slice definition. Instead of only monitoring the read-out gradients, also the selection gradients are monitored via current sensing. Based on the known input waveform 302 and the sensed output currents conclusions can be drawn, how the limited amplifier performance is compromising the output current. Due to the non-linear effect occurring in the active amplifier control loop, these compromising effects cannot be simply modelled but need to rely on measured input. The detected currents can be related to actual selection gradient fields 304 via the current to field transfer function (CGMTF) for the corresponding gradient channel. The pre-recorded transfer function CGMTF is used to predict, based on the sensed current, the actual selection gradient field $G_f$ in the gradient coil 310 via a simple convolution operation according to the following formula:

$$G'_S(t)=I(t)*CGMTF(t).$$

In one embodiment of the invention, the prediction of $G_S(t)$ is learned using artificial intelligence. By comparing the known desired input gradient $G_i(t)$ with the actual gradient $G'_S(t)$ realized in the bore and adding some describing parameters to the desired gradient (like max. gradient strength, slew rate, strength, variation when using VERSE, etc. . . . ) a simple convolutional network can be trained that is able to predict based on the nominal input gradient waveform and its basic parameters the actual one. The necessary training data can be generated during initial MRI system installation doing some test scans or during the initial testing phase of the final system. This learning could be performed in each MR system individually or when using identical hardware once in the factory, applying the trained AI model to the whole system fleet. The gradient waveform predicted this way can then be used in the RF design process, e.g. for low tip angles, to realize the target spatial selection profile.

In another embodiment of the invention, the selection gradient currents are monitored during the initial sequence dummy shots that are commonly applied to achieve steady state for the MR signal in a clinical scan. Feeding that back to RF pulse design, changing RF waveforms maybe on the fly during this dummy phase by considering the actually applied gradient fields to achieve better slice definition for upcoming RF pulses fixes the corresponding RF issue accordingly. It is obvious that these adaptations can be done to MR excitation, to refocusing or any spatially selective RF pulse used for instance for appropriate magnetization preparation. It should be further noted that this holds for RF pulses, that are spatially selective in one or multiple dimensions including the application to one or a number of transmit coils.

The proposed AI learning and dummy shot evaluation methods can also be used to better predict actual gradients during signal readout and thus may be a path to removing non-linear effects without continuous reading of output currents or direct gradient fields during imaging.

Figure 4:
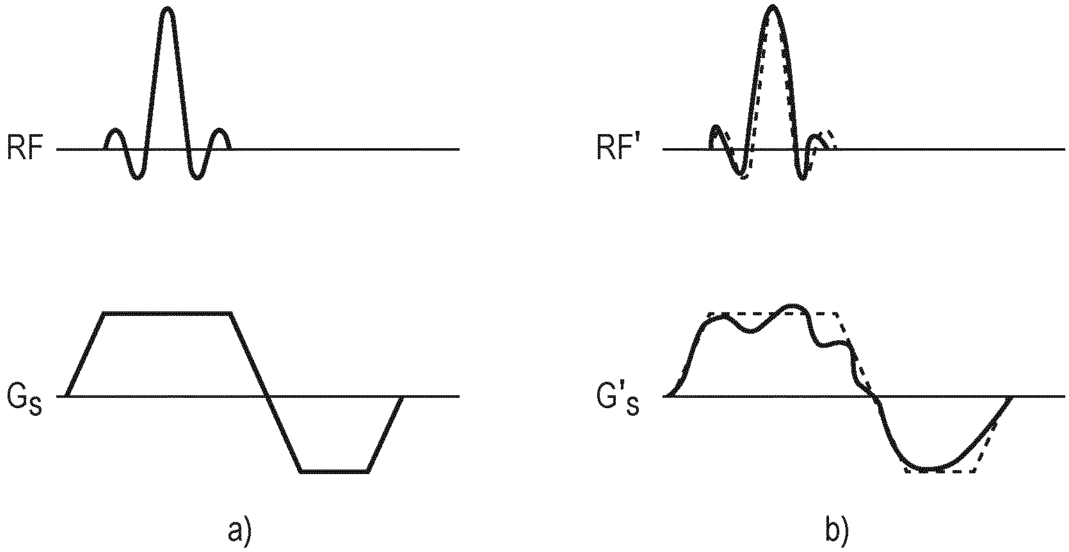
FIG. 4 depicts diagrams of the RF excitation adapted to the sample current waveform according to an embodiment of the invention.

FIG. 4 depicts diagrams of the RF excitation adapted to the sampled current waveform according to an embodiment of the invention. FIG. 4*a*) shows a normal excitation RF pulse applied in the presence of the selection gradient $G_S$ to excite an almost rectangular slice profile. The RF waveform and the slice profile achieved represent a Fourier pair in case of low tip angle excitation. FIG. 4*b*) shows the selection gradient in case of gradient waveform distortions $G'_S$. In this case a solution for the RF has to be applied to obtain a good slice profile. It can be calculated based on the measured amplifier output currents and the corresponding current to field transfer function of the used gradient coil, resulting in almost the same rectangular excitation profile as desired. In this case also the refocussing lobe after the RF pulse is important and must be considered in the RF design process, to make sure that all excited transversal magnetization is appropriately refocused to give a maximum SNR. The dotted lines illustrate the ideal waveforms for the two channels shown in FIG. 4*b*).

In an embodiment of the invention the case of sensing the gradient waveform during the start-up phase can be considered. This is basically illustrated in FIG. 4. For simplicity a slice section along the z direction is considered. While the selection gradient $G_S$ is played out, the current $I_z$ running in the z-gradient coil 110, 310 is sampled by the current sensor system 113, 312. The sampled current is convolved with the CGMTF which is measured once according to the following formula:

$$G's(t)=I_z(t)*CGMTFz(t)$$

The CGMTF may be measured once e.g. at the end of the MR system installation. As a result, the actual gradient $G'_S$ generated in the gradient coil 110, 310 can be obtained. When the RF excitation pulse belongs to the low tip angle class, for calculation the new and corrected RF pulse, Pauly's approach can be used. For this excitation case also, the refocussing lobes have to be considered although there is no RF present. It facilitates the refocussing of the excited transverse magnetization and should amount in the low tip angle approximation half of the integral of the selection gradient to maintain SNR. Please note, that the same formalism holds when using oblique selection gradients, which consist of all the three elementary gradient components. In this case the convolution given in the equation above has to include more components (at least x,y,z) of the sampled currents and the corresponding transfer functions (CGMTF). Please note, that the CGMTF has even more component than the basic gradients. Apart from the B0 term, higher order terms (including cross terms) could be considered to appropriately predict the actual field from the measured currents.

Figure 5:
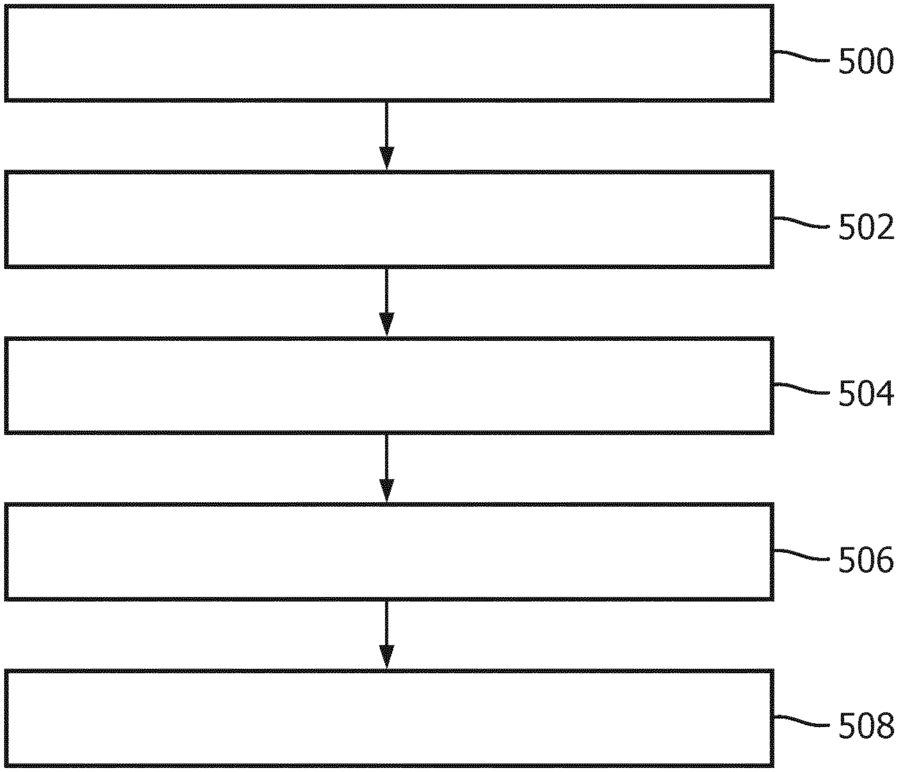
FIG. 5 shows a flow chart which illustrates a method of operating a gradient system according to FIG. 3.

FIG. 5 shows a flow chart which illustrates a method of operating a gradient system 102, 300 according to FIG. 3 for a magnetic resonance examination system 100 for generating a gradient magnetic field within an imaging zone 108 of the magnetic resonance examination system 100. First in step 500 a gradient system 102, 300 as described above is provided. Next in step 502 the electrical current supplied to the gradient coil by the gradient coil amplifier 112, 308 is sampled by the current sensor system 113, 312. An actual selection gradient pulse shape $G'_S$ is obtained by applying a current to field modulation transfer function (CGMTF) to the sampled electrical current in step 504. In step 506 gradient distortions of the actual selection gradient pulse shape $G'_S$ are predicted based on a known input selection gradient pulse shape $G_S$. Finally, in step 508 the gradient distortions of the actual selection gradient pulse shape $G'_S$ are corrected by the magnetic resonance examination system 100 by adapting radio frequency pulse shapes that are emitted concurrently with the actual selection gradient pulses $G'_S$.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a"

or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST magnetic resonance imaging system 100
gradient system 102
magnet 104
bore of magnet 106
imaging zone 108
region of interest 109
gradient coil 110
magnetic field gradient coil amplifier 112
current sensor system 113
radio-frequency coil 114
transceiver 116
subject 118
subject support 120
x-axis 122
y-axis 123
z-axis 124
computer system 126
hardware interface 128
processor 130
user interface 132
computer memory 134
machine executable instructions 140
gradient system 200
input waveform 202
gradient field evolution 204
pre-emphasis 206
gradient amplifier 208
gradient coils 210
current sensor system 212
AD converter 214
reconstruction 216
reconstructed image 218
gradient impulse response function GIRF
gradient modulation transfer function GMTF
current to field impulse response function CGIRF
current to field modulation transfer function CGMTF
gradient system 300
input gradient pulse shape 302
actual gradient pulse shape 304
pre-emphasis 306
gradient amplifier 308
gradient coils 310
current sensor system 312
AD converter 314
RF adaption 316
RF excitation adapted to the sampled current waveform 318
radio frequency pulse RF
selection gradient $G_S$
corrected radio frequency pulse RF'
actual selection gradient $G'_S$
providing a gradient system 500
sampling the electrical current 502
obtaining an actual selection gradient pulse shape 504
predicting gradient distortions of the 506
actual selection gradient pulse shape
correcting for gradient distortions of the 508
actual selection gradient pulse shape

The invention claimed is:

1. A gradient system for a magnetic resonance examination system, the gradient system comprising:

at least one gradient coil, when supplied with electrical current, configured to generate at least one selection gradient magnetic field for spatially selective excitation by transmitting selection gradient pulses, wherein the selection gradient field is a spatial read-encoding gradient field and/or a crusher gradient field and/or a slice selection gradient field and/or a slice refocusing gradient field and/or a gradient field spatially selective in one or multiple dimensions, and a gradient coil amplifier configured to supply the electrical current to the gradient coil, a current sensor system configured to sample an electrical current supplied to the gradient coil by the gradient coil amplifier, a controller configured to store a known input selection gradient pulse shape generated by a gradient waveform generator;

wherein the gradient system is further configured to prospectively determine, prior to execution of a spatially selective excitation, an actual selection gradient pulse shape predicted for an imaging zone by applying a current to field modulation transfer function (CGMTF) to the sampled electrical current, wherein the controller determines a predicted deviation between the predicted actual selection gradient pulse shape and the stored known input selection gradient pulse shape; and wherein the magnetic resonance examination system compensates for the predicted deviation by modifying a radio-frequency excitation pulse shape based on the stored known input selection gradient pulse shape and the predicted deviation, the modified radio-frequency excitation pulse shape being emitted concurrently with the selection gradient pulse during spatially selective excitation; and wherein the CGMTF describes how the gradient coil is translating the input current into the actual gradient field.

2. A magnetic resonance imaging system configured to acquire magnetic resonance imaging data from the imaging zone, wherein the magnetic resonance imaging system comprises a gradient system according to claim 1.

3. A method of operating a gradient system for use in a magnetic resonance examination system, wherein the system is used to generate a gradient magnetic field within an imaging zone of the magnetic resonance examination system, wherein the method comprises the following steps:

providing a gradient system according to claim 1, sampling the electrical current supplied to the gradient coil by the gradient coil amplifier by the current sensor system, obtaining an actual selection gradient pulse shape by applying a current to field modulation transfer function (CGMTF) to the sampled electrical current, predicting gradient distortions of the actual selection gradient pulse shape based on a known input selection gradient pulse shape, correcting for gradient distortions of the actual selection gradient pulse shape by a magnetic resonance examination system by emitting adapted radio frequency pulse shapes concurrently with the actual selection gradient pulses.

4. The method according to claim 3, wherein the step of obtaining the actual selection gradient pulse shape by applying a current to field modulation transfer function (CGMTF) to the sampled electrical current comprises the step of obtaining an actual selection gradient pulse shape by a convolution operation according to the following formula:

$$G'_S(t)=I(t)*CGMTF(t)$$

wherein:

$G'_S(t)$ is the actual selection gradient pulse shape,

I(t) is the sampled electrical current,

CGMTG(t) is the current to field modulation transfer function.

5. The method according to claim 3, wherein the current to field modulation transfer function (CGMTF) is prerecorded before applying the function to sampled electrical current for obtaining the actual selection gradient pulse shape.

6. The method according to claim 3, wherein the step of predicting gradient distortions of the actual selection gradient pulse shape based on a known input selection gradient pulse shape is performed by artificial intelligence.

7. The method according to claim 6, wherein the step of predicting gradient distortions of the actual selection gradient pulse shape by artificial intelligence comprises the step of using a trained convolutional neural network that returns the actual selection gradient pulse shape from parameter values representing the desired gradient pulse shape.

8. The method according to claim 7, wherein the parameters values are selected from the following list: max, gradient strength and/or slew rate and/or strength and/or variation when using variable-rate selective excitation (VERSE).

9. The method according to claim 4, wherein the step of sampling the electrical current supplied to the gradient coil by the gradient coil amplifier by the current sensor system, comprises the step of sampling the electrical current during a start-up phase of the magnetic resonance imaging system with initial sequence dummy shots, or a short prep-scan involving those gradient pulses in question.

10. The method according to claim 4, wherein the step of correcting for gradient distortions of the actual selection gradient pulse shape by a magnetic resonance examination system by adapting radio frequency pulse shapes that are emitted concurrently with the actual selection gradient pulses takes place in addition to correcting for gradient distortions of a read-out gradient of the gradient system.

11. A non-transitory computer readable medium configured to store instructions, wherein when the instructions are executed by a computer, cause the computer to control a magnetic resonance imaging system to correct for gradient distortions of an actual selection gradient pulse shape by adapting radio frequency pulse shapes that are emitted concurrently with the actual selection gradient pulses according to claim 3.

12. The gradient system according to claim 1, wherein the selection gradient field is a spatial read-encoding gradient field and also at least one of: a crusher gradient field and/or a slice selection gradient field and/or a slice refocusing gradient field and/or a gradient field spatially selective in one or multiple dimensions.

13. A gradient system for a magnetic resonance examination system, the gradient system comprising:

gradient coils configured to, when supplied with electrical current, generate spatial read-encoding gradient fields and selection gradient magnetic fields for spatially selective excitation in the imaging zone;

gradient coil amplifiers configured to supply the electrical currents to the gradient coils;

a current sensor system configured to sample the electrical currents supplied to the gradient coils by the gradient coil amplifiers;

a controller configured to store a known input selection gradient pulse shape generated by a gradient waveform generator;

wherein the gradient system is further configured to prospectively determine, prior to execution of a spatially selective excitation, predicted actual spatial read-encoding and selection gradient pulse shapes for an imaging zone by applying a current to field modulation transfer function (CGMTF) to the sampled electrical current, wherein the controller determines a predicted deviation between the predicted actual selection gradient pulse shape and the stored known input selection gradient pulse shape; and wherein the magnetic resonance examination system compensates for the predicted deviation by modifying a radio-frequency excitation pulse shape based on the stored known input selection gradient pulse shape and the predicted deviation, the modified radio-frequency excitation pulse shape being emitted concurrently with the selection gradient pulse during spatially selective excitation.

14. The gradient system according to claim 13, wherein the selection gradient magnetic field is a crusher gradient field and/or a slice selection gradient field and/or a slice refocusing gradient field and/or a gradient field spatially selective in one or multiple dimensions.

15. The gradient system according to claim 13, wherein the CGMTF describes how each gradient coil is translating the input current to that gradient coil into the actual gradient field generated by that gradient coil.

* * * * *